(12) United States Patent
Fishman et al.

(10) Patent No.: US 7,969,163 B2
(45) Date of Patent: Jun. 28, 2011

(54) MEASURING SIGNAL PROPAGATION AND ADJUSTABLE DELAYS IN ELECTRONIC DEVICES

(75) Inventors: Alex Fishman, Sunnyvale, CA (US); Serguei Dorofeev, Sunnyvale, CA (US); Andreas Weber, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 608 days.

(21) Appl. No.: 11/669,812

(22) Filed: Jan. 31, 2007

(65) Prior Publication Data

US 2007/0198202 A1 Aug. 23, 2007

Related U.S. Application Data

(60) Provisional application No. 60/776,075, filed on Feb. 23, 2006.

(51) Int. Cl.
*G01R 27/28* (2006.01)

(52) U.S. Cl. .......................... 324/617; 324/621

(58) Field of Classification Search .................. 324/614, 324/617; 375/377
See application file for complete search history.

(56) References Cited

U.S. PATENT DOCUMENTS

| | | | | |
|---|---|---|---|---|
| 2,820,141 A | * | 1/1958 | Weill et al. ..................... | 327/258 |
| 4,688,947 A | * | 8/1987 | Blaes et al. .................... | 368/120 |
| 4,813,059 A | * | 3/1989 | Minuhin et al. ............. | 375/241 |
| 7,196,526 B2 | * | 3/2007 | Vincent et al. ................ | 324/617 |
| 7,231,558 B2 | * | 6/2007 | Gentieu et al. ................ | 714/704 |
| 2004/0122607 A1 | | 6/2004 | Fishman et al. | |

FOREIGN PATENT DOCUMENTS

WO     WO 0010358     2/2008

OTHER PUBLICATIONS

Tektronix DC-5009 Specifications, Alliance Test Equipment Co., www.alliancetesteq.com, Aug. 27, 2010, p. 1.*

* cited by examiner

*Primary Examiner* — Thomas Valone
(74) *Attorney, Agent, or Firm* — Maschoff Gilmore & Israelsen

(57) ABSTRACT

Systems and methods to measure signal propagation delay through objects. The system includes a controller, a single shot pulse generator, a first pulse/edge former, a multiplexer/demultiplexer, a second pulse/edge former, a timer, and a counter. The controller initializes the system, the clock and the counter. A pulse is sent from the single shot pulse generator to the first pulse/edge former. The pulse is propagated through the first pulse/edge former to the multiplexer, through a device under test, to the demultiplexer, and to the second pulse/edge former. The second pulse edge generator provides the pulse to the counter, which counts a predetermined number of pulses, and the clock, which measures the amount of time the counter counts the pulses. The propagation delay of the device under test is then calculated based on the counted number of pulses and the elapsed time measured by the clock.

18 Claims, 3 Drawing Sheets

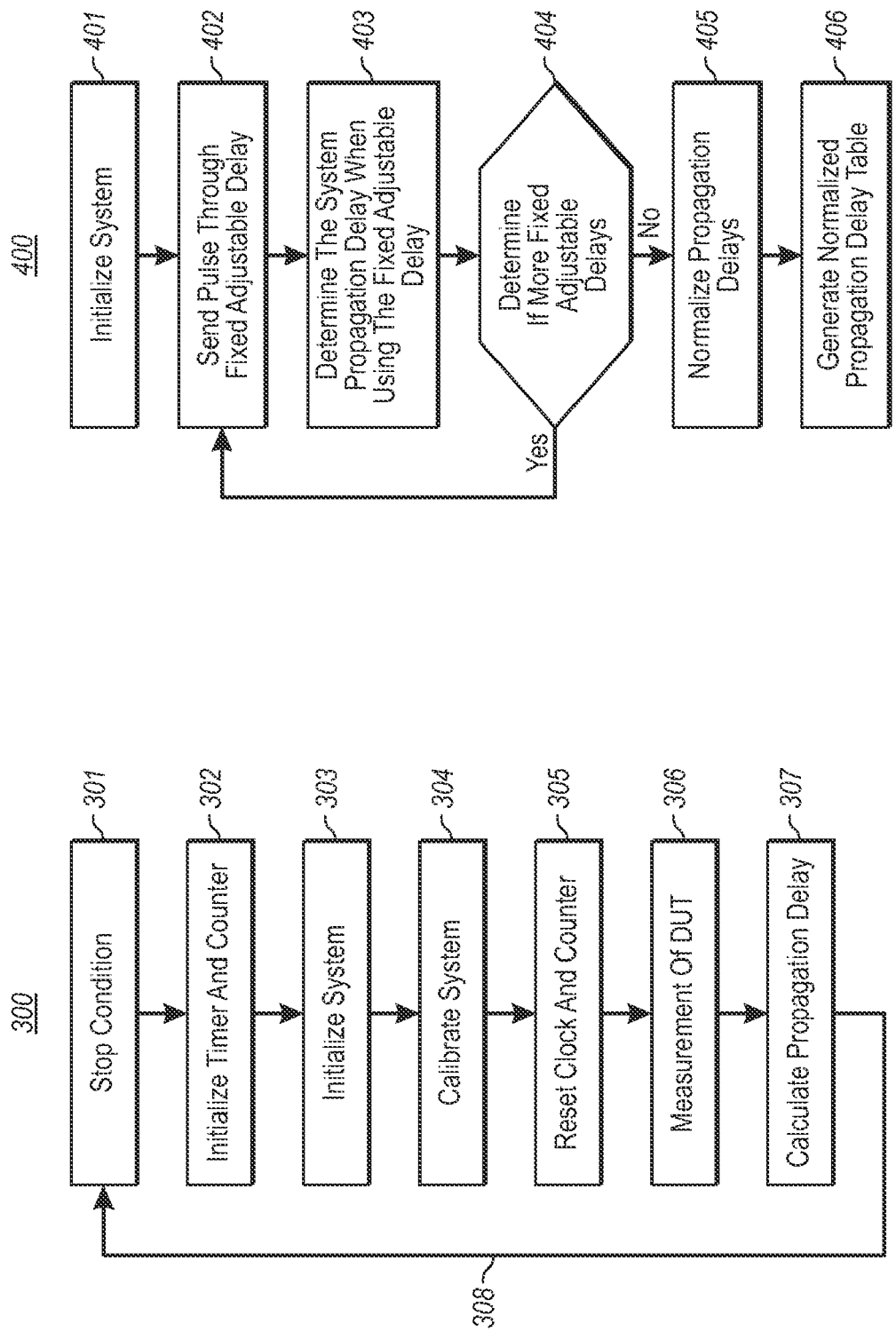

MEASURING SIGNAL PROPAGATION AND ADJUSTABLE DELAYS IN ELECTRONIC DEVICES

CROSS-REFERENCE TO RELATED APPLICATIONS

This application claims the benefit of U.S. Provisional Application No. 60/776,075, filed Feb. 23, 2006, which is incorporated herein by reference in its entirety.

BACKGROUND

1. The Field of the Invention

The present invention relates generally to an improvement in the ability of test systems to measure a signal propagation delay through objects (e.g., devices and/or cables used to connect these devices).

2. The Relevant Technology

A bit error rate ("BER") is a ratio of bits received, processed, and/or transmitted with errors to a total number of bits received, processed, and/or transmitted over a given period of time. If, for example, a transmission has 1 million bits and one of these bits is in error (e.g., a bit is in a first logic state instead of a second logic state), the transmission has a BER of $10^{-6}$. The BER is useful because it can be used to characterize the ability of a device to receive, process, and/or transmit bits.

Many devices are designed to receive, process, and then transmit a plurality of bits. An optoelectronic transceiver, for example, typically receives a plurality of bits in an electrical form and then transforms and transmits the bits in an optical form and/or receives a plurality of bits in an optical form and then transforms and transmits the bits in an electrical form. Such devices require a finite amount of time to make these transformations. This finite amount of time is known as the signal propagation delay. It is often useful to measure the signal propagation delay for a particular signal traveling from one point to another. The points can be relatively close, such as two devices on the same local area network, or widely scattered, such as two devices in different cities. Measuring the signal propagation delay enables individuals to identify whether or not data propagates efficiently between the two points.

In the past, measuring a propagation delay through a device and/or cables used to connect these devices was a costly operation that included expensive equipment such as an Agilent or Anritsu Signal Generator or the Agilent or Tektronix Digital Communication Analyzer. In order to use this prior art device, one needed a signal generator, a signal splitter, the device under test (DUT), and an oscilloscope with two channels. One would then need to connect the output of the signal generator through the signal splitter to the DUT input and the first channel of the oscilloscope. The second channel of the oscilloscope could then be connected to the DUT output. Then, using either the oscilloscope screen or the screen file of the analyzer, one could figure out the propagation delay, which would then correspond to a time distance between two wave forms. Using this method, scopes with a precise time base give better resolution. Unfortunately, one needs a very large memory capacity to measure long delays in a precise time base with high resolution.

BRIEF SUMMARY

The foregoing problems with the prior state of the art are overcome by embodiments of the present invention, which relate to test systems and methods to measure signal propagation delay through objects. The system in one embodiment includes a controller, a single shot pulse generator, a first pulse/edge former, a multiplexer, a demultiplexer, a second pulse/edge former, a timer, and a counter.

The controller initializes the system, the clock and the counter. A pulse is sent from the single shot pulse generator to the first pulse/edge former. The pulse is propagated through the first pulse/edge former to the demultiplexer, through a device under test, to the multiplexer, and to the second pulse/edge former. The second pulse edge generator provides the pulse to both the counter, which counts a predetermined number of pulses, and to the clock, which measures the amount of time the counter counts the pulses. The propagation delay of the device under test is then calculated based on the number of pulses counted and the elapsed time measured as by the clock.

Note that this Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 3 illustrates an example method of the present invention to measure propagation delay; and FIG. 4 illustrates an alternative method of the present invention to measure propagation delay.

DETAILED DESCRIPTION

The present invention relates to test systems and methods to measure signal propagation delay through objects. The system includes in one embodiment a controller, a single shot pulse generator, a first pulse/edge former, a multiplexer, a demultiplexer, a second pulse/edge former, a timer, and a counter.

The controller initializes the system, the clock and the counter. A pulse is sent from the single shot pulse generator to the first pulse/edge former. The pulse is propagated through the first pulse/edge former to the multiplexer, through a device under test, to the demultiplexer, and to the second pulse/edge former. The second pulse edge generator provides the pulse both to the counter, which counts a predetermined number of pulses, and to the clock, which measures the amount of time the counter counts the pulses. The propagation delay of the device under test is then calculated based on the number of pulses counted and the elapsed time measured as by the clock.

Reference will now be made to the drawings to describe example embodiments of the invention. It is to be understood that the drawings are diagrammatic and schematic representations of the example embodiments, and are not limiting of the present invention, nor are they necessarily drawn to scale.

Figure 1:
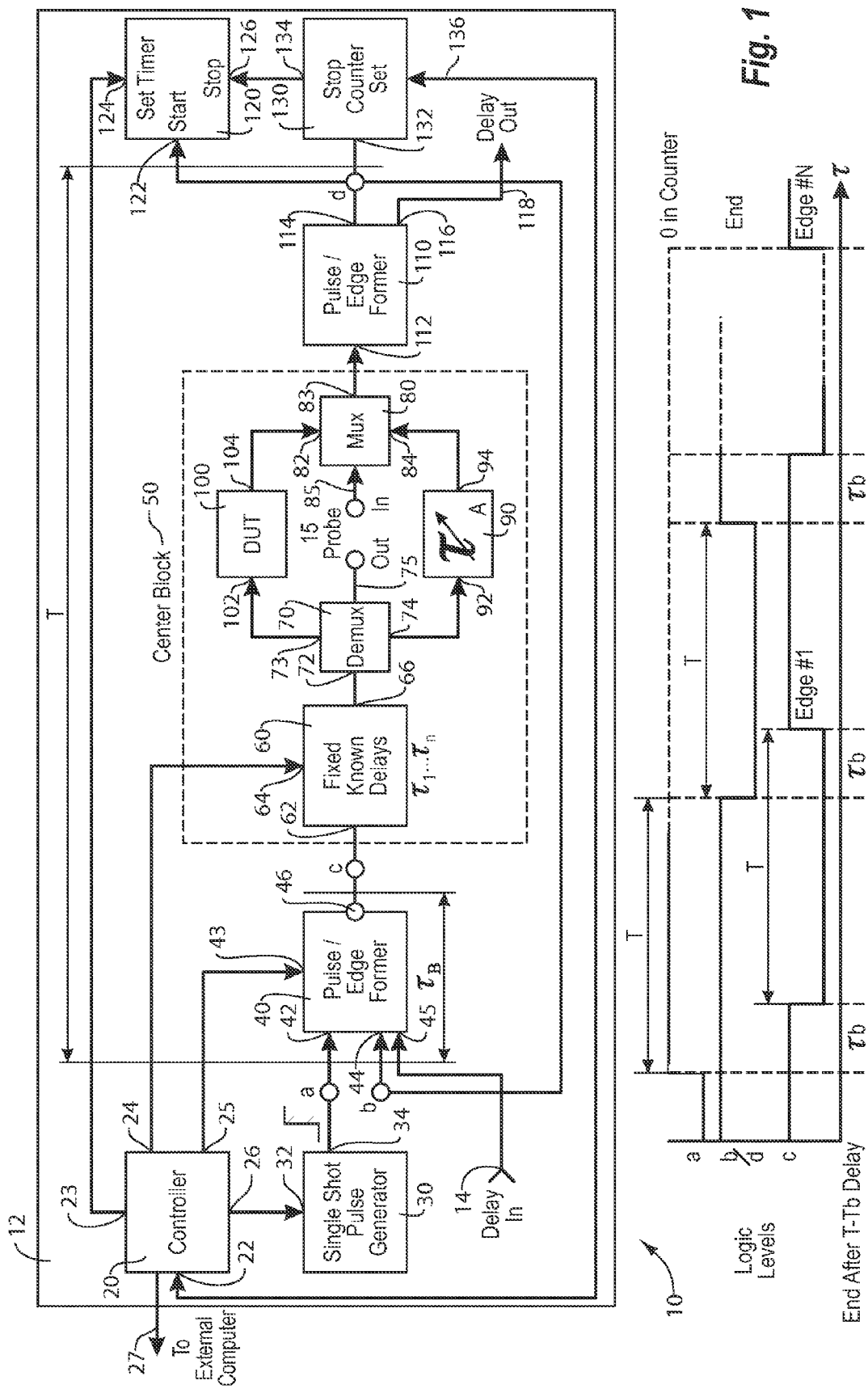
FIG. 1 is a block diagram of an example system in accordance with the present invention.

Referring to FIG. 1, there is shown a system 10 consistent with an embodiment of the present invention. As illustrated in FIG. 1, system 10 includes a circuit board 12 that can be an isolated board that provides power and ground connections for various electrical components mounted or housed thereon. Illustratively, mounted to circuit board 12 are a controller 20, a pulse generator 30, a first pulse/edge former 40, and a center block 50. Center block 50 can include a circuit 60 that accounts for fixed and/or known delays, a demultiplexer 70, a multiplexer 80, adjustable delay 90, and electrical connections for a device under test (DUT) 100. Electrically connected to center block 50 is a second pulse/edge former 110. Also mounted on board 12 can be a clock/timer 120 and a counter 130. Additional components are also possible, depending on the specific function(s) to be performed. Likewise, in alternate embodiments, some of the components could be combined. For example, timer 120 and counter 130 could be integrated within controller 20. The specific connections between, and functions of, these components will be discussed in greater detail below.

The controller 20 can include a computer processor on a microchip such as, by way of example and not limitation, a Motorola® 8-bit processor or other chip combining an 8-bit architecture with an array of field-programmable logic. In some embodiments, controller 20 can include multiple chips located on circuit board 12. The controller 20 can direct the operation of circuitry on circuit board 12 (not all connections illustrated) and can store and/or manipulate data provided by this circuitry.

The controller 20 includes a first I/O port 22, a second I/O port 23, a third I/O port 24, a fourth I/O port 25, a fifth I/O port 26, and a sixth I/O port 27. The controller 20 can also include additional inputs, outputs, and/or I/O ports (connections not illustrated). The controller 20 can send and receive control signals, configuration data, etc. to some or all of the circuitry and/or devices illustrated in FIG. 1 without departing from the scope of the present invention. In the configuration illustrated in FIG. 1, first I/O port 22 is connected to counter 130, second I/O port 23 is connected to set timer 120, third I/O port 24 is connected to fixed known delays circuitry 60, fourth I/O port 25 is connected to first pulse/edge former 40, and fifth I/O port 26 is connected to single shot pulse generator 30. In addition, sixth I/O port 27 is connected to an external computer 200 as will be described in further detail with respect to FIG. 2. In addition, although it is not illustrated, demultiplexer 70 and multiplexer 80 are also connected to and controlled by controller 20. The specific functions of controller 20 with respect to embodiments of the present invention will be discussed below in greater detail.

The various I/O ports of controller 20 and the other components of circuit board 12 can be either parallel or serial ports. These ports are used to transmit control signals from the controller 20 to the various components on circuit board 12 and/or to receive information from the various components on circuit board 12 at controller 20. These control signals can, for example, initialize single shot pulse generator 30 and start timer 120 and counter 130 as part of the process of determining the propagation delay through DUT 100. These ports can furthermore include a plurality of separate signals for address bits, an alarm interrupt, a chip select, a write input, a read input, a bus type select, a test input, an address latch enable, and other control parameters.

The single shot pulse generator 30 can include an input port 32 that receives various control signals from controller 20. The pulse generator 30 can also include one or more output ports 34 that provide an output for signals generated by pulse generator 30. For example, pulse generator 30 can generate a signal as either high pulse or low pulse. In operation, the generator can be set to generate a continuous low pulse until input is received from controller 20 to generate a high pulse of a desired duration. For the desired duration, pulse generator 30 generates a high pulse, and then returns to generating a low pulse. In alternate embodiments, pulse generator 30 can generate a continuous high pulse until input is received from controller 20 to generate a low pulse for a given duration. In the embodiment illustrated in FIG. 1, pulse generator 30 can be, by way of example, and not limitation, an ONSEMI NBSG53A, or other reasonable pulse generator.

The pulse generated by pulse generator 30 is output from port 34 and received by input port 42 of pulse/edge former 40. Additionally, pulse/edge former 40 can include an input or I/O port 43 that receives input from controller 20, an I/O port 44 that receives input from and transmits data to an I/O port 114 in pulse/edge former 110, an input port 45 that can receive a delay IN signal 14, and an output port 46 that can transmit an output signal to input port 62 of fixed known delays circuitry 60, when implemented, or an input port 72 of demultiplexer 70, both of which form part of center block 50. Pulse/edge former 40 is used to provide alternating high and low pulses that trigger the propagation delay measurements in the other components of circuit board 12 as will be described in more detail to follow. In the embodiment illustrated in FIG. 1, pulse/edge former 40 can be, by way of example, and not limitation, an ONSEMI NBSG53A, or other reasonable pulse/edge former.

The fixed known delays circuitry 60 can be set using input from controller 20 at I/O port 64 to account for one or more known signal propagation delays, as illustrated by $T_1 \ldots T_n$. This will be explained in more detail below. A specific time delay is then built into the output of fixed known delays circuitry 60 at output port 66, which transmits the signal to an input port 72 of demultiplexer 70. In some embodiments, the output of fixed known delays circuitry 60 can be zero. In the embodiment illustrated in FIG. 1, known delay circuitry 60 can be any known delay circuit known in the art. Specifically, known delay circuitry can be by way of example, and not limitation, an ONSEMI MC100EP196, an ELMEC CDKF03C, or other reasonably known circuit delay.

The demultiplexer 70 is configured to work with a propagation delay probe 15 in various ways depending on the measurement needs, as will be explained. For example, in one embodiment the terminals of the propagation delay probe 15 are shorted to enable a propagation delay measurement without a device under test to calibrate the system. In this case, demultiplexer 70 propagates the signal received from pulse edge former 40 through fixed known delays 60 to output port 75 and to input port 85 of multiplexer 80. This signal is then sent from output port 83, out of center block 50, to input port 112 of second pulse/edge former 110. In some embodiments, demultiplexer 70 and multiplexer 80 can be different ports of the same device. For example, demultiplexer 70 and multiplexer 80 can be a device, such as by way of example and not limitation a HITTITE SP3T Switch HMC245Q516 which can be used for both applications.

In another embodiment, propagation delay probe 15 is used to measure a device under test (DUT). In this case, demultiplexer 70 propagates the signal received from pulse edge former 40 through fixed known delays 60 to an output port 73 and to an input port 102 of DUT 100. This signal then passes from an output port 104 of DUT 100 to an input port 82 of multiplexer 80. The multiplexer 80 can then transmit the signal from output port 83, out of center block 50, to an input port 112 of second pulse/edge former 110.

While DUT 100 is shown as being located on board 12, this need not be the case. With the configuration illustrated in FIG. 1, DUT 100 can be any electrical, electronic, or optoelectronic device for which an individual might desire to know a propagation delay through the device such as a transceiver. In other configurations of circuit board 12, specifically other configurations of center block 50, DUT 100 can also be an optical device. In such a case, output port 73 of demultiplexer 70 and input port 82 of multiplexer 80 can be configured to transmit/receive optical signals, rather than electrical signals. Optical signals should, however, be converted to electrical signals to perform the propagation delay measurements in accordance with the principles of the present invention.

In an additional embodiment, adjustable delay 90 may be implemented to work as a precision controllable delay for an external system. Adjustable delay 90 may include any number of different fixed delays that are used to create an adjustable propagation delay. In some embodiments, the fixed known delays may be different length traces on the board 12. The different lengths may be designed to provide 10 picoseconds delays from pair to pair, for example. In other embodiments, the traces may be designed to provide 80 picoseconds delay from trace to trace. Multiplexing and demultiplexing the traces connection will allow for propagation delay measurement, adjustment, and control.

In FIG. 1, adjustable delay block 90 is used to represent all the fixed known delays. Demultiplexer 70 propagates the signal received through fixed known delays 60 from pulse edge former 40 to output port 74 and to an input port 92 of adjustable delay 90. The signal then passes from an output port 94 of adjustable delay 90 to an input port 84 of multiplexer 80. The multiplexer 80 can then transmit the signal from output port 83, out of center block 50, to an input port 112 of second pulse/edge former 110. Adjustable delay 90 will be discussed in further detail with respect to FIG. 4. Adjustable delay 90 can be by way of example, and not limitation, an ONSEMI MC100EP196 or any other reasonable adjustable delay.

Second pulse/edge former 110 can further include a first output port 114 that sends the signal to input port 122 of timer 120, input port 132 of counter 130, and/or input port 44 of first pulse/edge former 40. The second pulse/edge former is used to provide the negative and positive pulses to first pulse/edge generator in order to facilitate system 10 oscillations as will be described below. Additionally, second pulse/edge former 110 can include an output port 116 that sends a signal to a delay OUT 118. In the embodiment illustrated in FIG. 1, second pulse/edge former 110 can be by way of example, and not limitation, an ONSEMI NB6L239 or any other reasonable pulse/edge former.

Delay IN port 14 and delay OUT port 118 may be implemented in system 10 to allow the system 10 to be utilized in an exterior system. For example, in some embodiments it may be desirable to use the propagation delay of center block 50, first pulse/edge former 40 and second edge former 110 as the delay for external test equipment. Delay IN port 14 and delay OUT port 118 facilitate such external use.

Stop counter 130 can further include an I/O port 136 that connects to I/O port 22 in controller 20, and an output port 134 that connects counter 130 to input port 126 of timer 120. Likewise, timer 120 can further include an I/O port 124 that connects timer 120 with I/O port 23 in controller 20. In the embodiment illustrated in FIG. 1, counter 130 and timer 120 can be any reasonable counter and timer as known to one skilled in the art. As previously mentioned, in some embodiment the timer 120 and/or the counter 130 can be an integral part of controller 20. In yet other embodiments, both timer 120 and counter 130 can be integrated into a single chip separate from controller 20.

FIG. 1 also illustrates a delay T that is produced by the portions of system 10. In addition, FIG. 1 illustrates various logic levels at different points (i.e., points a, b/d, and c) in system 10. These logic levels are further illustrated with their effect on delay T as will be descried in more detail to follow.

The block diagram shown in FIG. 1 provides only a single example of a specific system/electrical circuitry configuration that can be used with embodiments of the present invention. It should be noted that generally input ports receive data into a particular component, output ports transmit data from the component, and I/O ports both transmit and receive data from the component. In any chip where a particular input or output port is identified, one skilled in the art will realize that an I/O port could be used as well. Likewise, the specific ports and connections shown are for the purposes of illustration only. Additional electrical and/or optical connections are also possible, and fall within the scope of the embodiments. Furthermore, where specific examples are provided for particular chips or chip sets located on circuit board 12, these examples are provided for the purposes of illustration only, and should not be construed to limit the embodiments of the invention in any way. Other similar components that perform the desired function(s) can be substituted as desired.

As previously discussed, the specific embodiments of system 10 and circuit board 12 are provided for the purposes of illustration only. Specific methods that use the circuit arrangement discussed above to perform a measurement of a signal propagation delay will be discussed below with reference to FIGS. 3 and 4. It is understood that the system illustrated in FIG. 1 and discussed above is provided for the purposes of illustration only, and that any methods for measuring a signal propagation delay is not dependent on the specific hardware configuration illustrated in FIG. 1.

Figure 2:
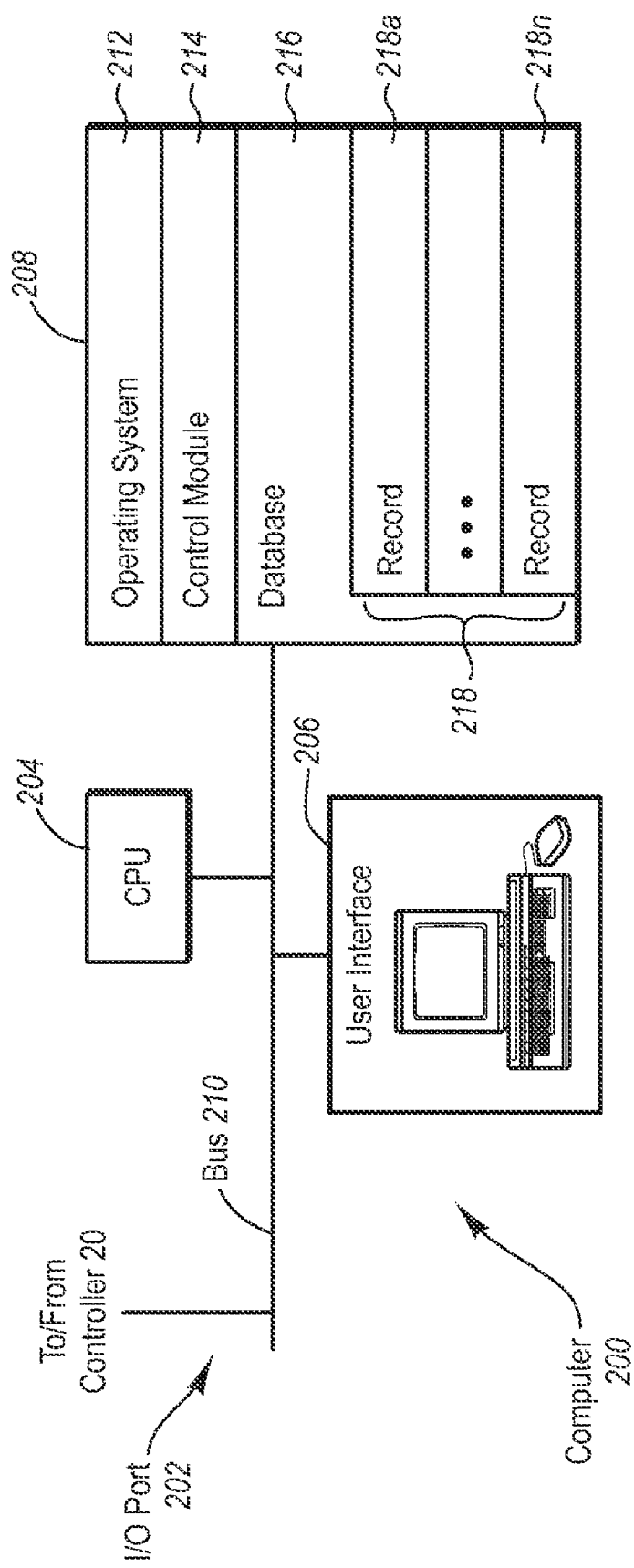
FIG. 2 is a block diagram of an example computer system coupled to the system of FIG. 1.

Referring to FIG. 2, there is shown a detailed illustration of a computer 200. As previously mentioned, the controller 20 communicates with computer 200 through sixth I/O port 27 (shown in FIG. 1), which is connected to I/O port 202 of computer 200. In example embodiments, computer 200 exchanges control signals and/or data with controller 20, which interacts with some or all of the other circuitry on circuit board 12, to setup, initiate, and monitor measurements.

Computer 200 further includes standard computer components such as one or more processing units 204, one or more user interfaces 206 (e.g., keyboard, mouse, and a display), memory 208, and one or more buses 210 to interconnect these components. The memory 208, which can include high speed random access memory as well as non-volatile storage such as disk storage, can store an operating system 212, a control module 214, and a database (or one or more files) 216, which can include a plurality of records 218a-218n.

An operating system 212 can include procedures for handling various basic system services and for performing hardware dependent tasks. The one or more processing units 204 can execute, for example, tasks for control module 214 under the direction of operating system 212. The operating system 212 can also provide control module 214 with access to other system resources such as, but not limited to, memory 208 and user interface 206.

The control module 214 is designed to manipulate system 10 in accordance with the present invention. In particular, control module 214 interacts with controller 20 through I/O port 202 to initiate and monitor measurements. As described in more detail below, control module 214 directs controller 20 to initialize one or more other components included in system 10 and, if need be, to obtain information about the one or more other components that are not connected directly to computer 200. The control module 214 can engage in such communication with controller 20 before, during, and after measurements. The control module 214 can communicate results of measurements through user interface 206 as needed.

Although separate ports are illustrated in FIGS. 1 and 2 and discussed above with respect to various circuitries, some embodiments of the present invention can include additional or fewer ports without departing from the scope of the present invention. For example, a single data bus with address bits and corresponding ports can be substituted for some or all of the data ports and corresponding connections illustrated in FIG. 1. Additionally, some or all of the port connections, though illustrated in FIGS. 1 and 2 as single leads, can be formed by a plurality of separate leads. The configuration illustrated in FIGS. 1 and 2, therefore, represents just one example embodiment and is not meant to limit the scope of the present invention.

Referring now to FIG. 3, a method 300 of an embodiment of the present invention to measure propagation delay is illustrated. This method will be described with reference to the measurement and computing systems of FIGS. 1 and 2.

Method 300 includes a stop condition (step 301). Stop condition 301 represents the state of system 10 prior to performing a propagation delay measurement in accordance with the principles of the present invention. For example, single pulse generator 30 may be configured by controller 20 using I/O port 26 and input port 32 to provide a constant low pulse at output port 34 during this state. The low pulse is provided to input port 42 of pulse/edge former 40. Pulse/edge former 40 also receives a constant high pulse at input port 44 during this state. Because pulse/edge former 40 has a NAND structure, having a high and low pulse at each input causes output port 46 to provide a constant high pulse to the other components in system 10. The constant high pulse causes the remaining components is system 10 to remain in an inactive state.

Method 300 also includes initializing the timer and counter circuitry (step 302). For example, controller 20 may receive instructions from control module 214 instructing that timer 120 and counter 130 be initialized. In some embodiments, controller 20 can independently evaluate the need to initialize timer 120 and counter 130. Controller 20 sends a command from I/O port 23 to timer input port 124 that sets timer 120 to time zero. In like manner, controller 20 sends a command for I/O port 22 to counter input port 136 that sets counter 130 to some number N of predetermined pulses. The number N of predetermined pulses may vary according to the measurement precision desired. For example, in some embodiments the predetermined N number of pulses may be 10^6, 10^7, or 10^8 pulses.

Method 300 further includes initializing the system (step 303). For example, controller 20 may receive instructions from control module 214 instructing that the system 10 be initialized. In some embodiments, controller 20 can independently evaluate the need to initialize system 10. Controller 20 sends a command using I/O port 26 and input port 32 directing single shot pulse generator 30 to begin providing a constant high pulse from output port 34.

The high pulse is received by pulse/edge former input port 42. As pulse/edge former 40 has a NAND structure, its output at output port 46 will change from a high pulse to a low pulse. It should be noted that a delay $T_b$ is introduced into the system. Delay $T_b$ accounts for the time between when pulse/edge former 40 receives the high pulse at input port 42 and when pulse/edge former 40 changes output at output port 46 and is due to the inability of pulse/edge former 40 to change instantaneously. Delay $T_b$ is part of the overall propagation delay of system 10 as shown in FIG. 1.

The low pulse from output port 46 is propagated through the various components of center block 50 to input port 112 of pulse/edge former 110. The low pulse is provided to timer 120 and counter 130 by output port 114 as will be described. In addition, pulse/edge former 110 provides the low pulse from output port 114 to input port 44 of pulse/edge former 40.

The resulting low pulse at input port 44 of pulse/edge former 40 along with the constant high pulse at input port 42 cause the output port 46 to provide a high pulse to center block 50 and pulse/edge former 110. Pulse/edge former 110 in turn provides the high pulse to pulse/edge former 40, which causes output port 46 to again provide a low pulse to center block 50 and pulse/edge former 110. This process is repeated for as long as single shot pulse generator 30 provides a constant high pulse to pulse/edge former 40, causing system 10 to oscillate. The oscillation between high and low pulses is used to measure the propagation delay in a device under test as will be described. The period of oscillation is 2T, where T represents the propagation delay through pulse/edge former 40 (delay $T_b$), center block 50, and pulse/edge former 110. The propagation delay through center block 50 will change depending on whether a device under test is implemented or not.

Method 300 includes calibrating the system (step 304). For example, as mentioned in step 302, timer 120 and counter 130 are initialized. The first low pulse from output 46 of pulse/edge former 40 as discussed in step 303 is propagated through center block 50 as described. Specifically, the low pulse propagates to multiplexer input 72 of demultiplexer 70 (the fixed known delays 60 either being not implemented or configured to be zero in this embodiment). Since the system is being calibrated in this step, demultiplexer 70 is configured to work through the propagation delay probe 15 using output port 75. The low pulse propagates to port 85 of multiplexer 80 and then to pulse/edge former 110 using input port 112. It is very important to have either probe 15 emulating the DUT 100 connection propagation delay or probe 15 terminals should be closed during calibration. During the measurement, the DUT 100 should be inserted between the probe 15 terminals.

The pulse/edge former 110 provides the low pulse to counter input 132 of counter 130. When the counter sees this first low pulse, it begins to decrement one pulse count from the N number of predetermined pulses. As system 10 oscillates, counter 130 will decrement one additional pulse count every time it sees a negative pulse, which will happen every period of 2T as described above. Counter 130 will continue to decrement one pulse count per negative pulse until it has decremented to zero.

The pulse/edge former 110 also provides the low pulse to timer input 122 of timer 120. When the timer sees this first low pulse, it begins to measure elapsed time. The timer will continue to measure elapsed time until instructed to stop by counter 130. For example, when counter 130 decrements to zero, it sends a signal from output port 134 to timer input port 126 that stops the timer from measuring elapsed time.

The propagation delay of system 10 without a device under test can be calculated once counter 130 has decremented to zero and timer 120 has stopped counting elapsed time.

The known propagation delay (T) of system 10 is as follows:

$$T = \text{Elapsed Time}/2(N-1) \qquad (1)$$

The resulting propagation delay represents the delay of the pulse signal passing through both the pulse/edge formers 40 and 110 and center block 50. The elapsed time is provided by timer 120 and is divided by two because a period between high and low pulses is 2T. The number N of predetermined pulses is subtracted by one to account for the first pulse triggering the counting and measuring of time. CPU 204 can perform the calculation of equation 1. The propagation delay for the system without a device under test may be stored in data base 216 of computer 200 for later use as will be described.

Method 300 further includes reinitializing the clock and the timer (step 305). For example, the timer 120 and the counter 130 may be reinitialized as described in step 302. During this step, system 10 will continue to oscillate between low and high pulses.

Method 300 also includes measuring the propagation delay in a device under test (step 306). For example, as mentioned in step 305, timer 120 and counter 130 are initialized to time zero and a predetermined number N of pulses respectively. A low pulse from output 46 of pulse/edge former 40 is propagated through center block 50 as described. Specifically, the low pulse propagates to multiplexer input 72 of multiplexer 70 (the fixed known delays 60 either being not implemented or configured to be zero in this embodiment). Demultiplexer 70 passes the low pulse from port 73 to input port 102 of the device under test (DUT) 100, which provides the low pulse from output port 104 to input port 82 of multiplexer 80 and then to pulse/edge former 110 using input port 112.

The pulse/edge former 110 provides the low pulse to counter input 132 of counter 130. When the counter sees this first low pulse after being reinitialized, it begins to decrement one pulse count from N number of predetermined pulses. As system 10 oscillates, counter 130 will decrement one additional pulse count every time it sees a negative pulse, which will happen every period of 2T as described above. Counter 130 will decrement one pulse count per negative pulse until it has decremented to zero.

The pulse/edge former 110 also provides the low pulse to timer input 122 of timer 120. When the timer sees this first low pulse after being reinitialized, it begins to measure elapsed time. The timer 120 will continue to measure elapsed time until instructed to stop by counter 130 in the manner described previously.

The propagation delay of system 10 with a DUT is calculated once counter 130 has decremented to zero and timer 120 has stopped counting elapsed time. The calculation is made using equation (1) and the result is provided to database 216 of computer 200. The propagation delay calculated here will consist of the propagation delay of the DUT and the propagation delay of system 10.

Method 300 further includes calculating the propagation delay of the DUT (step 307). This may be accomplished by subtracting the known propagation delay of the system without a DUT from the propagation delay of the system with a DUT. For example, CPU 204 may access the known propagation delay calculated during the calibration step 304 and the propagation delay calculated during the measurement step 306 in database 216. CPU 204 may then subtract the propagation delay calculated during the calibration step 304 (propagation delay of system 10) from the propagation delay calculated during the measurement step 306 (propagation delay of system 10 and the DUT) to find the propagation delay of the DUT.

Method 300 also includes reassertion of the stop condition (step 308). For example, once system 10 and computer 200 have calculated the propagation delay for the DUT, control module 214 may direct controller 20 to end the propagation delay measurement. Controller 20 sends a signal using I/O port 26 to input port 32 instructing single shot pulse generator 34 to provide a constant low pulse at output port 34. This low pulse is provided to input port 42 of pulse/edge former 40, which causes pulse/edge former 40 to provide a high pulse at output port 46. This causes the other components of system 10 to go into an inactive state.

Referring to FIG. 4, a method 400 of an alternative embodiment of the present invention is illustrated. Method 400 is designed to find a relative propagation delay and will be described in relation to FIGS. 1 and 2.

Method 400 includes initializing the system (step 401). For example, controller 20 can set timer 120 to time zero and counter 130 to a number N of predetermined pulses as described in relation to method 300. In addition, controller 20 can direct the single shot pulse generator 30 to output a constant high pulse in order to start system 10 oscillating as previously described in method 300.

Method 400 also includes sending a pulse signal through a first one of the N number of adjustable delays (step 402). For example, the first low pulse from output 46 of pulse/edge former 40, after the system is initialized is propagated through center block 50. In this embodiment, demultiplexer 70 is configured to work with fixed adjustable delays 90. In this case, the low pulse propagates to input 72 of demultiplexer 70 (the fixed known delay 60 either being not implemented or configured to be zero in this embodiment). Demultiplexer 70 passes the low pulse from port 74 to input port 92 of one of the adjustable delays. The signal propagates through the adjustable delay to input port 84 of multiplexer 80 and then to pulse/edge former 110 using input port 112.

The pulse/edge former 110 provides the low pulse to counter input 132 of counter 130. When the counter sees this first low pulse, it begins to decrement one pulse count from N number of predetermined pulses. As system 10 oscillates, counter 130 will decrement one additional pulse count every time it sees a negative pulse, which will happen every period of 2T as described above. Counter 130 will decrement one pulse count per negative pulse until it has decremented to zero.

The pulse/edge former 110 also provides the low pulse to timer input 122 of timer 120. When the timer sees this first low pulse, it begins to measure elapsed time. The timer 120 will continue to measure elapsed time until instructed to stop by counter 130 in the manner described previously.

Method 400 further includes determining the propagation delay of the system when using the fixed adjustable delay (step 403). For example, the propagation delay of system 10 when using the fixed adjustable delay of step 402 is calculated once counter 130 has decremented to zero and timer 120 has stopped counting elapsed time. The calculation is made by CPU 204 using equation (1) and the result is provided to database 216 of computer 200. The propagation delay calculated here will consist of the propagation delay of system 10 using the fixed adjustable delay of step 402.

Method 400 further includes determining if any additional adjustable delays of the N number of adjustable delays are present for which a propagation delay may be determined (decision block 404). If it is determined that there is an additional adjustable delay (Yes in decision block 404), then steps 402 and 403 are repeated for the additional adjustable delay. In this way, a propagation delay may be determined for all N number of adjustable delays. Note that in some embodiments, the clock and timers may need to be reset when calculating a new propagation delay. On the other hand, if it is determined that there are no more adjustable delays for which a propagation delay may be found (No in decision block 404), then method 400 will proceed to step 405.

Method 400 also includes normalizing the propagation delays (step 405). As mentioned, the propagation delays for the N number of fixed adjustable delays are recorded in database 216. The shortest or smallest propagation delay is ascertained from the database. This shortest or smallest propagation delay is then set to be a relative zero delay. This value is then subtracted by CPU 204 from the other delays to normalize them to the shortest or smallest propagation delay.

Method 400 finally includes generating a table of the normalized propagation delays (step 406). For example, CPU 405 may create in database 216 a table of the normalized propagation values for the N number of adjustable delays. As mentioned, the shortest or smallest propagation delay is set to zero delay. The resulting propagation delay table will display the relative propagation delay of the fixed adjustable delays and will be accessible to a user who desires to test a DUT using a relative delay. This is sufficient for many applications where knowing the relative propagation delay between fixed adjustable delays is desirable.

In some embodiments, a fixed known delays 60 is implemented in system 10. As previously described, fixed known delays 60 may be any fixed known delay known in the art and may be any delay value including zero. Fixed known delays 60 is implemented to allow system 10 to measure and calculate very short propagation delays that the circuitry of system 10 could not otherwise handle due to the inherent limitations of the individual components in system 10. For example, suppose a signal has a high frequency and speed. A fixed known delays 60 can be implemented during the calibration step as described in step 304 and the propagation of the system without a DUT can be determined as described in method 300. Since the known fixed delay is used, a propagation delay can be measured and calculated.

The propagation delay using the fixed known delay and a DUT can then be determined as described in method 300, specifically step 306. The overall propagation delay of the DUT is then determined as described in step 307 by subtracting the propagation delay without the DUT from the propagation delay with the DUT. Since the same fixed known delay is used in both propagation calculations, it is canceled out and has no effect on the overall propagation delay result. Fixed known delays 60 can also used in conjunction with adjustable known delay 90. Advantageously, use of the fixed known delay allows system 10 to measure propagation delays at very high frequencies. In other words, the known delay 60 allows the use of inexpensive timers and counters because they do not have to work at very high frequencies.

Accordingly, the present invention relates to systems and methods that improve the ability of test systems to measure signal propagation delay through objects. The disclosed system and methods are much cheaper to implement than the purchase of a standard digital communications analyzer. The equipment needed to implement the invention is available off the shelf, and collectively costs tens of thousands of dollars less than a commercial communications analyzer. Yet the disclosed methods are very accurate. Accordingly, the present invention is a significant advancement in the art of measuring signal propagation delay.

It should be clearly understood that the embodiments of the invention described above are to be considered in all respects only as illustrative and not restrictive and are not intended as limitations on the scope of the invention, which is defined only by the claims that are now or may later be presented. The scope of the invention is, therefore, indicated by the appended claims rather than by the foregoing description. All changes which come within the meaning and range of equivalency of the claims are to be embraced within their scope.

What is claimed is:

1. A system for measuring a signal propagation delay through a device under test, said system comprising:
    one or more pulse/edge formers configured to transmit a plurality of pulses through at least two signal paths, one of which includes the device, and a second one which does not;
    a controller configured to control the pulse/edge former;
    a counter configured to count a number of said plurality of pulses; and
    a timer configured to measure an elapsed time it takes for said number of pulses to propagate through the system, wherein a system delay is calculated from said elapsed time and said number and the propagation delay through the device is calculated based on the system delay.

2. The system of claim 1, wherein said device is one of an electrical device, an electronic device and an opto-electronic device.

3. The system of claim 1, wherein said signal propagation delay is calculated by first removing said device from said system and using said elapsed time and said number to calculate a known delay for said system, and wherein said signal propagation delay is then calculated by subtracting said known delay from said system delay.

4. The system of claim 1, wherein at least some of the signal paths other than the signal path for the device include a delay element, each delay element having a different amount of delay for comparison with the propagation delay through the device.

5. The system of claim 4, wherein said signal propagation delay is calculated by transmitting a plurality of said pulses through a first fixed delay element and using said elapsed time and said number to calculate a first propagation delay for said system, and by transmitting a plurality of said pulses through a second fixed delay element and using said elapsed time and said number to calculate a second propagation delay for said system, and wherein a normalized signal propagation delay is then calculated by subtracting said first propagation delay for said system from said second propagation delay for said system.

6. The system of claim 1, further comprising fixed known delay circuitry coupled to receive and provide a fixed known delay to said plurality of pulses from the one or more pulse/edge formers before the plurality of pulses are transmitted through the one or more parallel signal paths.

7. The system of claim 3, wherein said propagation delay is calculated to an accuracy within 1 picosecond.

8. The system of claim 1, wherein said number of said plurality of pulses is greater than one hundred thousand.

9. The system of claim 1, wherein said number of said plurality of pulses is at least one hundred million.

10. The system of claim 1, wherein said timer is a 0.001 millisecond step timer or less.

11. A method for computing a signal propagation delay through a device under test, the method comprising:
- at a controller connected to a pulse/edge former, controlling the pulse/edge former to send pulses to a counter through at least the device and fixed delay circuitry having a known amount of delay, the device being configured in series with the fixed delay circuitry;
- measuring a first period of elapsed time for a predetermined number of the pulses to propagate through at least the fixed delay circuitry and the device to the counter; and
- calculating the propagation delay through the device based on the predetermined number of pulses and the first period of elapsed time.

12. A method in accordance with claim 11, further comprising before measuring the elapsed time:
- setting a clock that measures the elapsed time to time zero;
- setting a counter to the predetermined number of pulses.

13. A method in accordance with claim 12, wherein the clock that measures the elapsed time begins to measure elapsed time upon receiving a first one of the pulses from the device and the clock stops measuring the elapsed time upon the counter decrementing to zero.

14. A method in accordance with claim 11 further comprising:
- sending pulses through a delay element with a first one of a number of adjustable delays
- determining a propagation delay for each adjustable delay by measuring how long a predetermined number of pulses take to propagate through each adjustable delay;
- normalizing the determined propagation delays for each adjustable delay with reference to the shortest propagation delay; and
- generating a table comprising the normalized propagation delays for the adjustable delay for comparison with the propagation delay through the device.

15. A method in accordance with claim 11, wherein said propagation delay is calculated to an accuracy within 1 picosecond or less.

16. A method in accordance with claim 11, wherein said number of predetermined pulses is greater than one hundred thousand.

17. A system for measuring a signal propagation delay through a device, said system comprising:
- a pulse edge/former configured to generate a pulsed signal;
- known delay circuitry configured to receive the pulsed signal before transmitting the pulsed signal to the device;
- a counter configured to count a predetermined number of pulses in the pulsed signal that propagate through the known delay circuitry and the device;
- timing circuitry configured to measure an amount of time the pulsed signal takes to propagate through the known delay circuitry and the device.
- a controller configured to calculate the propagation delay through the device based on the amount of time measured by the timing circuitry.

18. The system of claim 17, wherein the controller is configured to calculate the propagation delay based on a known amount of delay introduced by the system measuring the propagation delay.

* * * * *